United States Patent [19]

Hori et al.

[11] Patent Number: 5,158,903

[45] Date of Patent: Oct. 27, 1992

[54] METHOD FOR PRODUCING A FIELD-EFFECT TYPE SEMICONDUCTOR DEVICE

[75] Inventors: Atsushi Hori, Moriguchi; Shuichi Kameyama, Itami; Hiroshi Shimomura, Moriguchi; Mizuki Segawa, Hirakata, all of Japan

[73] Assignee: Matsushita Electric Industrial Co., Ltd., Osaka, Japan

[21] Appl. No.: 606,493

[22] Filed: Oct. 31, 1990

[30] Foreign Application Priority Data

Nov. 1, 1989 [JP] Japan .................. 1-286818

[51] Int. Cl.$^5$ .......................... H01L 21/336
[52] U.S. Cl. ............................ 437/45; 437/35; 437/44; 437/193; 148/DIG. 1; 357/23.3
[58] Field of Search ............ 437/44, 45, 191, 193, 437/41, 35; 357/23.8, 23.12, 23.3; 148/DIG. 1

[56] References Cited

U.S. PATENT DOCUMENTS

| | | | |
|---|---|---|---|
| 4,249,968 | 2/1981 | Gardiner et al. | 437/191 |
| 4,744,859 | 5/1988 | Hu et al. | 437/41 |
| 4,808,555 | 2/1989 | Mauntel et al. | 437/193 |
| 4,906,589 | 3/1990 | Chao | 437/44 |

FOREIGN PATENT DOCUMENTS

| | | |
|---|---|---|
| 56-19671 | 2/1981 | Japan . |
| 59-61185 | 4/1984 | Japan . |
| 1-117066 | 5/1989 | Japan . |
| 1-187923 | 7/1989 | Japan . |
| 1-243418 | 9/1989 | Japan . |

*Primary Examiner*—T. N. Quach
*Attorney, Agent, or Firm*—Ratner & Prestia

[57] ABSTRACT

A method for producing field-effect type semiconductor devices is disclosed which includes the steps of: forming a gate insulator film on a semiconductor substrate; forming a conductor film on the gate insulator film; and implanting impurity ions in the semiconductor substrate through the gate insulator film and the conductor film for the purpose of controlling a threshold voltage of the device, wherein the conductor film is employed as a gate electrode of the device. The method of this invention has the excellent advantages of readily controlling a threshold voltage of field-effect type semiconductor devices and of preventing the scatter of the threshold voltage values. An alternative embodiment employs formation of a second conductor film and implantation from an inclined direction.

3 Claims, 5 Drawing Sheets

METHOD FOR PRODUCING A FIELD-EFFECT TYPE SEMICONDUCTOR DEVICE

BACKGROUND OF THE INVENTION

1. Field of the Invention

This invention relates to a method for producing a field-effect type semiconductor device, and more particularly, it relates to a method for producing a field-effect type semiconductor device, by which the production of transistor elements contained therein, involving control of a threshold voltage, can readily be conducted with high stability.

2. Description of the Prior Art

The recent amazing progress in the field of microelectronics centered with respect to integrated circuits have been bringing about a great social revolution comparable to the Industrial Revolution, together with such great advances as seen today in the field of optoelectronics and more particularly in the laser technology. Since the integrated circuit was first invented, the degree of integration in integrated circuits has become greater by leaps and bounds, and indeed there have been successively developed large scale ICs (LSIs), very large scale ICs (VLSIs), and ultra large scale ICs (ULSIs). Such high degrees of integration have been achieved through dimensional miniaturization of elements, improvement of device construction and circuits, and so on.

For example, in the production of field-effect type integrated circuits, together with improvement of the degree of integration, much effort is directed toward the miniaturization of transistor elements (particularly, the making of thinner gate insulator films). For thinner gate insulator films, however, some problems may be encountered in increasing a breakdown voltage and in controlling a threshold voltage of the device.

FIGS. 5A to 5D show a typical process for conventional fabrication of transistor elements used in field-effect type integrated circuits. First, in the surface region of a semiconductor substrate 101 such as those made of silicon, an oxide film 103 is formed by thermal oxidation, after which as shown in FIG. 5A, impurities such as boron ions are implanted in the semiconductor substrate 101 to form a P⁻-type region 102, thereby attaining control of a threshold voltage. Next, as shown in FIG. 5B, the oxide film 103 is removed by an etching technique, followed by formation of a gate insulator film 104 on the semiconductor substrate 101. Then, as shown in FIG. 5C, at the prescribed position on the gate insulator film 104, a gate electrode 105 is formed, which is made of a polycrystalline semiconductor material such as polycrystalline silicon. Thereafter, according to the producing process for conventional MOS type semiconductor devices, the N⁺-type source/drain regions 110 are formed, interlayer insulating film 112 is deposited on the entire surface, and aluminum wirings 113 are formed, resulting in a transistor element of the field-effect type integrated circuits, as shown in FIG. 5D.

In such a method for producing field-effect type semiconductor devices, however, there will be some problems as follows:

(1) Because the gate insulator film 104 is formed after ion implantation conducted for the purpose of controlling a threshold voltage, crystal defects generated by the ion implantation in the semiconductor substrate 101 may be taken into the gate insulator film 104, thereby reducing the reliability of the device.

(2) Because the gate insulator film 104 is formed after ion implantation conducted for the purpose of controlling a threshold voltage, crystal defects generated by the ion implantation in the semiconductor substrate 101 may be redistributed within the semiconductor substrate 101 during the subsequent oxidation step, thereby degrading the degree of inversion voltage control. Furthermore, even if the dose of impurity ions is predetermined by considering the redistribution of impurity ions, the variation in time and temperature used in the formation of the gate insulator film 104 may be directly reflected in the scatter of inversion voltage values, thereby making it difficult to control the threshold voltage with high accuracy.

(3) Because the gate insulator film 104 is formed after ion implantation conducted for the purpose of controlling a threshold voltage, impurity ions generated by the ion implantation in the semiconductor substrate 101 may be diffused into the deep portion of the semiconductor substrate 101, thereby deteriorating the threshold voltage particularly of buried channel MOSFETs with shorter channel lengths. This imposes a restriction on the miniaturization of transistor elements contained in integrated circuits.

(4) In cases where the thickness of the gate insulator film 104 departs from the prescribed value, it is difficult to perform reoxidation for the purpose of adjusting the thickness of the gate insulator film 104 to the prescribed value.

SUMMARY OF THE INVENTION

The first method for producing a field-effect type semiconductor device of this invention, which overcomes the above-discussed and numerous other disadvantages and deficiencies of the prior art, comprises the steps of forming a gate insulator film on a semiconductor substrate; forming a conductor film on the gate insulator film; and implanting impurity ions in the semiconductor substrate through the gate insulator film and the conductor film for the purpose of controlling a threshold voltage of the device, wherein the conductor film is employed as a gate electrode of the device.

In a preferred embodiment, the aforementioned conductor film is amorphous.

The second method for producing a field-effect type semiconductor device of this invention, which overcomes the above-discussed and numerous other disadvantages and deficiencies of the prior art, comprises the steps of forming a gate insulator film on a semiconductor substrate; forming a first conductor film on the gate insulator film; implanting impurity ions in the semiconductor substrate through the gate insulator film and the first conductor film for the purpose of controlling a threshold voltage of the device; and forming a second conductor film on the first conductor film, wherein the first and second conductor films are employed as a gate electrode.

In a preferred embodiment, the aforementioned first conductor film is amorphous and the aformentioned second conductor film is polycrystalline.

The third method for producing a field-effect type semiconductor device of this invention, which overcomes the above-discussed and numerous other disadvantages and deficiencies of the prior art, comprises the steps of forming a first insulator film, which serves as a gate insulator film, on a semiconductor substrate of a first conductivity type; forming a first conductor film on the first insulator film; implanting impurity ions in the semiconductor substrate through the first insulator film and the first conductor film for the purpose of controlling a threshold voltage of the device; forming a second conductor film on the first conductor film and patterning the second conductor film; implanting impurity ions in the semiconductor substrate through the first insulator film and the first conductor film with the use of the patterned second conductor film as a mask to form a first semiconductor region of a second conductivity; thereafter forming a second insulator film on the entire surface, followed by anisotropic etching of the patterned second insulator film to form a spacer composed of parts of the patterned second insulator film which are left on the side walls thereof; and implanting impurity ions in the semiconductor substrate through the first insulator film with the use of the patterned second conductor film and the spacer present on the side walls thereof as a mask to form a second semiconductor region of the second conductivity, wherein the first and second conductor films are employed as a gate electrode and the first and second semiconductor regions serve as a lightly doped drain (LDD) and source/drain region, respectively.

In a preferred embodiment, the aforementioned first conductor film is amorphous and the aforementioned second conductor film is polycrystalline.

The fourth method for producing a field-effect type semiconductor device of this invention, which overcomes the above-discussed and numerous other disadvantages and deficiencies of the prior art, comprises the steps of forming a first insulator film, which serves as a gate insulator film, on a semiconductor substrate of a first conductivity type; forming a first conductor film on the first insulator film; forming a second conductor film on the first conductor film and patterning the second conductor film; implanting impurity ions in the semiconductor substrate through the first insulator film and the first conductor film from an inclined direction with the use of the patterned second conductor film as a mask for the purpose of controlling the threshold voltage of the device; implanting impurity ions in the semiconductor substrate through the first insulator film and the first conductor film from a substantially perpendicular direction with the use of the patterned second conductor film as a mask to form a first semiconductor region of a second conductivity; forming a spacer composed of parts of the patterned second insulator film which are left on the side walls thereof by anisotropic etching of the second insulator film; and implanting impurity ions in the semiconductor substrate through the first insulator film from a substantially perpendicular direction with the use of the second conductor film and the spacer present on the side walls thereof as a mask to form a second semiconductor region of the second conductivity, wherein the first and second conductor films are employed as a gate electrode and the first and second semiconductor regions serve as a lightly doped drain (LDD) and source/drain region, respectively.

In a preferred embodiment, the aforementioned first conductor film is amorphous and the aforementioned second conductor film is polycrystalline.

In a preferred embodiment, the aforementioned impurity ions used for controlling the threshold voltage are implanted along a direction inclined at an angle of 40 to 45 degrees from the direction perpendicular to the surface of the aforementioned semiconductor substrate.

Thus, the invention described herein makes possible the objectives of (1) providing a method for producing a field-effect type semiconductor device which has a gate insulator film with high crystallinity and hence has a high breakdown voltage and reliability; (2) providing a method for producing a field-effect type semiconductor device, in which ion implantation is conducted for the purpose of controlling a threshold voltage after formation of a gate insulator film, so that the concentration profile of implanted impurity ions is not affected by the formation of the gate insulator film, resulting in an easy control of a threshold voltage and only a slight variation in the threshold voltage; (3) providing a method for producing a field-effect type semiconductor device, in which the threshold voltage will not deteriorate even in the case of buried channel MOSFETs with shorter channel lengths, because the diffusion of impurity ions into the deep portion of the semiconductor substrate can be prevented; (4) providing a method for producing a field-effect type semiconductor device, which is particularly suitable for mass production of these devices, because even in cases where the thickness of a gate insulator film departs from the prescribed value, it is possible to perform reoxidation for the purpose of adjusting the thickness of the gate insulator film to the prescribed value without adverse effect on the threshold voltage; and (5) providing a method for producing a field-effect type semiconductor device which exhibits excellent driving characteristics, because the impurity concentration at the center portion in the channel area can be made small in cases where ion implantation is conducted for the purpose of controlling a threshold voltage after formation of a gate electrode.

BRIEF DESCRIPTION OF THE DRAWINGS

This invention may be better understood and its numerous objectives and advantages will become apparent to those skilled in the art by reference to the accompanying drawings as follows.

DESCRIPTION OF THE PREFERRED EMBODIMENTS

Example 1

FIGS. 1A to 1E shows the production of a field-effect type semiconductor device by a method of this invention. The method used in this example will be explained below with reference to these figures.

Figure 1A:
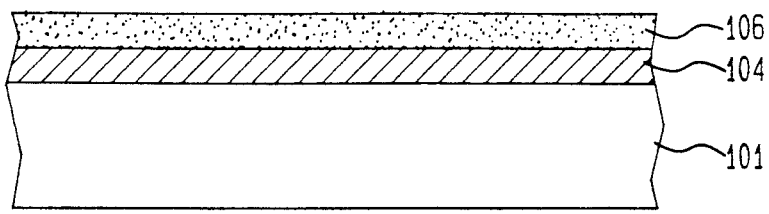
FIGS. 1A to 1E are sectional views showing a method for producing field-effect type semiconductor devices according to this invention.

First, as shown in FIG. 1A, in the surface portion of a P-type silicon substrate 101, a gate insulator film 104 (the thickness thereof being 10 to 15 nm) was formed by thermal oxidation, after which an amorphous silicon film 106 (the thickness thereof being 50 to 60 nm) was formed thereon.

Figure 1B:
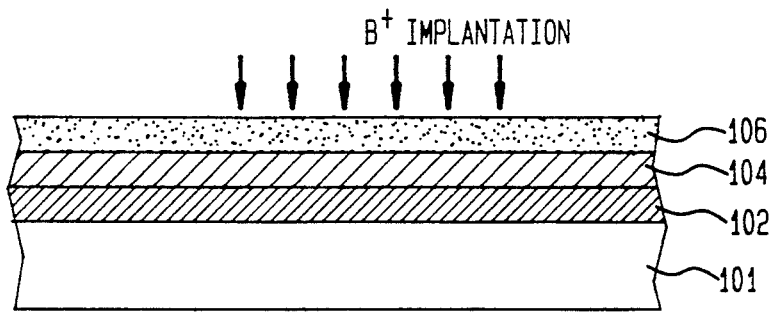

Next, for the purpose of controlling an inversion voltage of the device, impurity ions (e.g., boron ions, B+) were implanted in the P-type silicon substrate 101 through the gate insulator film 104 and the amorphous silicon film 106 to form a P⁻-type region 102, as shown in FIG. 1B. At that time, the implantation energy was set to a value in the range of 30 to 40 keV and the dose of impurity ions was set to a value in the range of 3 to $5 \times 10^{12}$ ions/cm$^{-2}$.

Figure 1C:
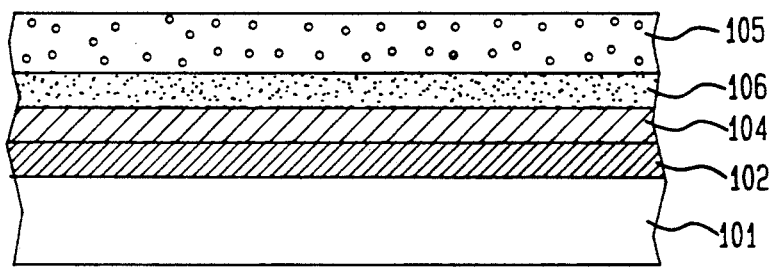

Then, as shown in FIG. 1C, a polycrystalline silicon film 105 (the thickness thereof being 250 to 350 nm) was formed on the amorphous silicon film 106, after which impurity ions (e.g., P+) were diffused by vapor phase reaction to give the N-type conductivity to each of the amorphous silicon film 106 and the polycrystalline silicon film 105.

Figure 1D:
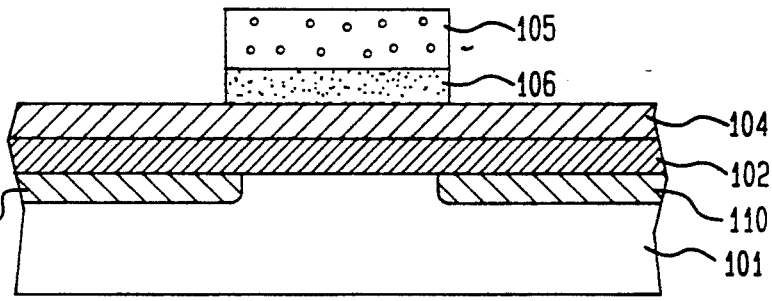
Figure 1E:
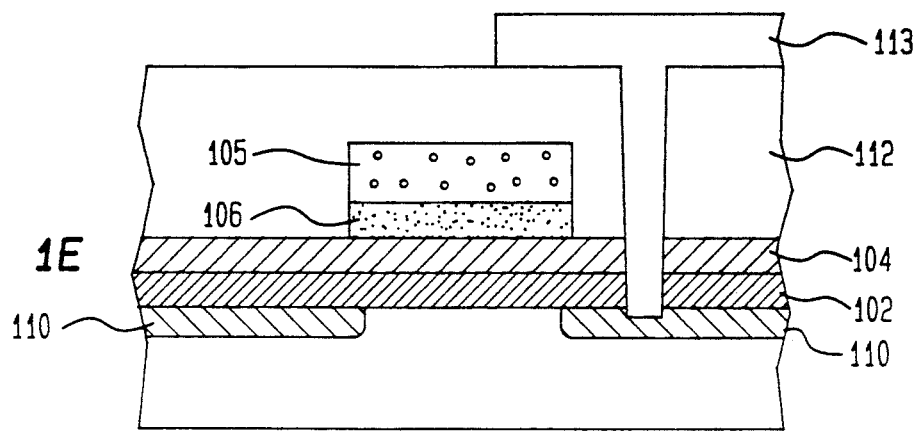

Next, as shown in FIG. 1D, a gate electrode which was composed of the amorphous silicon film 106 and the polycrystalline silicon film 105 was formed by an etching technique. Thereafter, according to an ordinary producing process for MOS type semiconductor devices, an N+-type source/drain region 110 was formed, an interlayer insulator film 112 was deposited on the entire surface, and aluminum wirings 113 were formed, resulting in a field-effect type semiconductor device as shown in FIG. 1E. In this figure, only a part of the aluminum wirings 113 is shown for simplicity (i.e., aluminum wirings for one of the source/drain regions and for the gate electrode are omitted from the figure).

The field-effect type semiconductor device obtained in this way had the following excellent advantages. Because the gate insulator film 104 was formed on the semiconductor substrate 101 before ion implantation was conducted for the purpose of controlling a threshold voltage, the gate insulator film 104 had a high crystallinity, so that the breakdown voltage and reliability of the device were improved. Also, because ion implantation was conducted for the purpose of controlling a threshold voltage after formation of the gate insulator film 104, the concentration profile of implanted impurity ions was not adversely affected by the formation of the gate insulator film 104, so that it was possible to readily control the threshold voltage and obtain substantially the same value as the prescribed value of the threshold voltage. Furthermore, in cases where the thickness of the gate insulator film 104 departs from the prescribed value, the reoxidation of the gate insulator film 104 for the purpose of adjusting the thickness thereof to the prescribed value had no adverse effect on the threshold voltage. These excellent advantages indicate that the method of this example is particularly suitable for mass production of field-effect type semiconductor devices.

In the aforementioned example, although the polycrystalline silicon film 105 and the amorphous silicon film 106 were used as a gate electrode, metals such as molybdenum or tungsten, or alternatively high-melting point metal compounds such as tungsten silicide, can also be used to form a gate electrode with a lower resistivity, which brings about the improvement of the operating speed of integrated circuits.

Moreover, in place of the amorphous silicon film 106 formed on the gate insulator film 104 and constituting a part of the gate electrode, amorphous metal materials such as amorphous tungsten can be used to obtain uniform impurity profiles with no channeling of the impurity ions implanted for the purpose of controlling a threshold voltage. In ordinary cases where boron ions are implanted at an energy of 30 to 40 keV, the use of a gate insulator film with a thickness of 10 to 15 nm is completely insufficient to prevent the channeling of the implanted boron ions, so that it is necessary to use a silicon oxide film with a thickness of about 50 nm. In cases where a thin film of the amorphous metal is used, this thin film can serve as a gate electrode, even if it has such a small thickness that impurity ions implanted for the purpose of controlling a threshold voltage can sufficiently pass through the film.

Example 2

FIGS. 2A to 2E shows the production of a field-effect type semiconductor device by another method of this invention. The method used in this example will be explained below with reference to these figures.

Figure 2A:
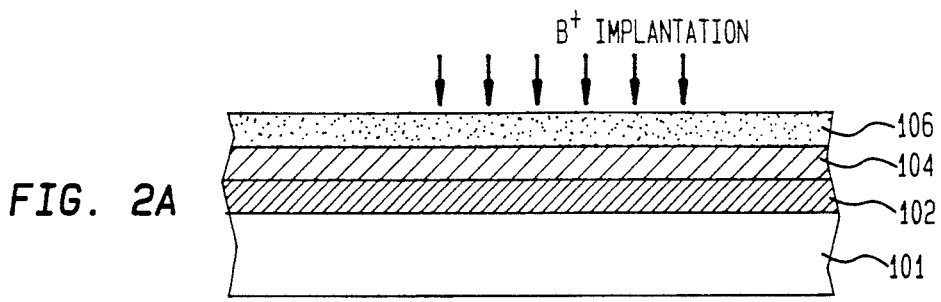
FIGS. 2A to 2E are sectional views showing another method for producing field-effect type semiconductor devices according to this invention.

First, as shown in FIG. 2A, in the surface portion of a P-type silicon substrate 101, a gate insulator film 104 (the thickness thereof being 10 to 15 nm) was formed by thermal oxidation, after which an amorphous silicon film 106 (the thickness thereof being 50 to 60 nm) was formed thereon. Next, for the purpose of controlling a threshold voltage of the device, impurity ions (e.g., boron ions, B+) were implanted in the P-type silicon substrate 101 through the gate insulator film 104 and the amorphous silicon film 106 to form a P⁻-type region 102, as shown in FIG. 2A. At that time, the implantation energy was set to a value in the range of 30 to 40 keV and the dose of impurity ions was set to a value in the range of 3 to $5 \times 10^{12}$ ions/cm$^{-2}$.

Figure 2B:
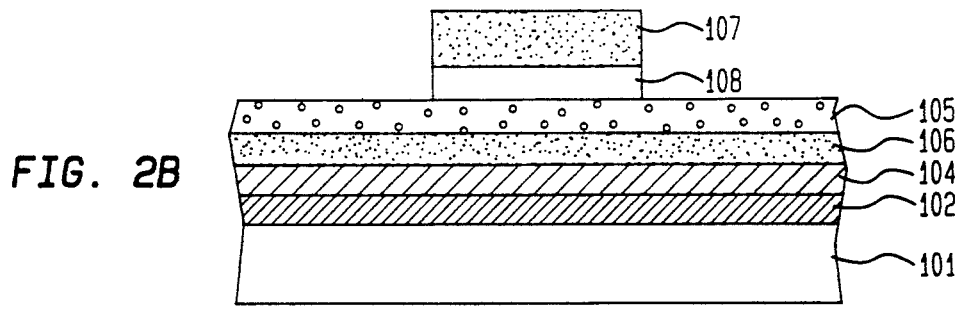

Then, as shown in FIG. 2B, a polycrystalline silicon film 105 (the thickness thereof being 150 to 250 nm) and a silicon oxide film 108 (the thickness thereof being 100 to 150 nm) were successively formed on the amorphous silicon film 106. Thereafter, the silicon oxide film 108 was etched with the use of a photoresist 107 as a mask, and the polycrystalline silicon film 105 was then etched with the use of the silicon oxide film 108 as a mask. At that time, an oxide film which had been spontaneously formed on the surface of the amorphous silicon film 106 served as an etching stop layer.

Figure 2C:
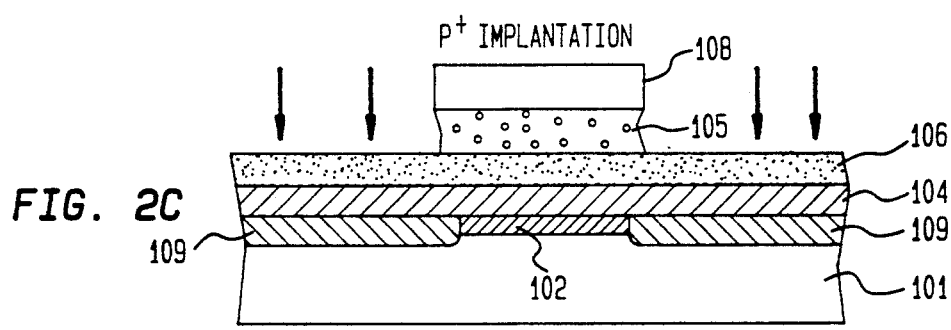

Next, as shown in FIG. 2C, impurity ions (e.g., phosphorus ions, P+) were implanted in the P-type silicon substrate 101 through the gate insulator film 104 and the amorphous silicon film 106 with the use of the polycrystalline silicon film 105 and the silicon oxide film 108 as a mask to form N⁻-type regions 109 which serve as lightly doped drains (LDDs). The dose of impurity ions was set at a value in the range of 2 to $4 \times 10^{13}$ ions/cm$^{-2}$.

Figure 2D:
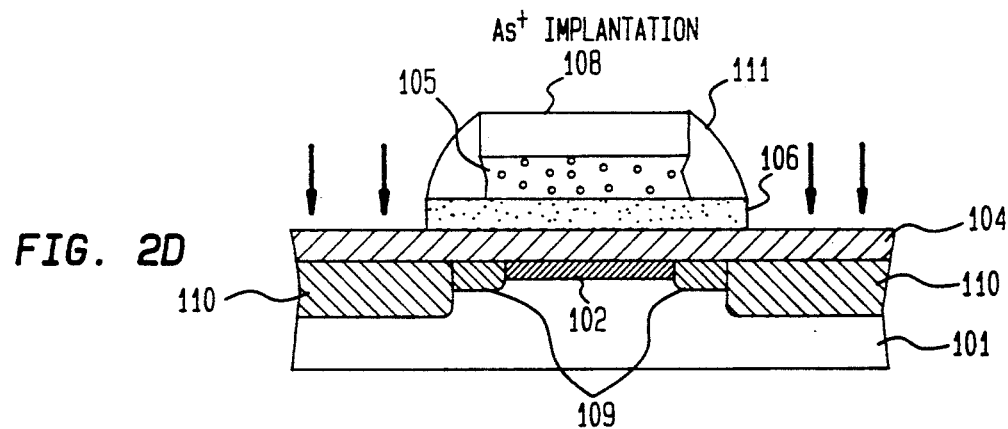

Subsequently, on the entire surface, an oxide film was again deposited to have a flat surface, after which this oxide film and the amorphous silicon film 106 were etched in a self-aligned manner to form gate side walls 111 as shown in FIG. 2D. Then, impurity ions (e.g., arsenic ions, As+) were implanted in the P-type silicon substrate 101 through the gate insulator film 104 with the use of the silicon oxide film 108 and the gate side walls 111 as a mask to form N+-type source/drain regions 110 as shown in FIG. 2D. The dose of impurity ions was set at a value in the range of 4 to $7 \times 10^{15}$ ions/cm$^{-2}$.

Figure 2E:
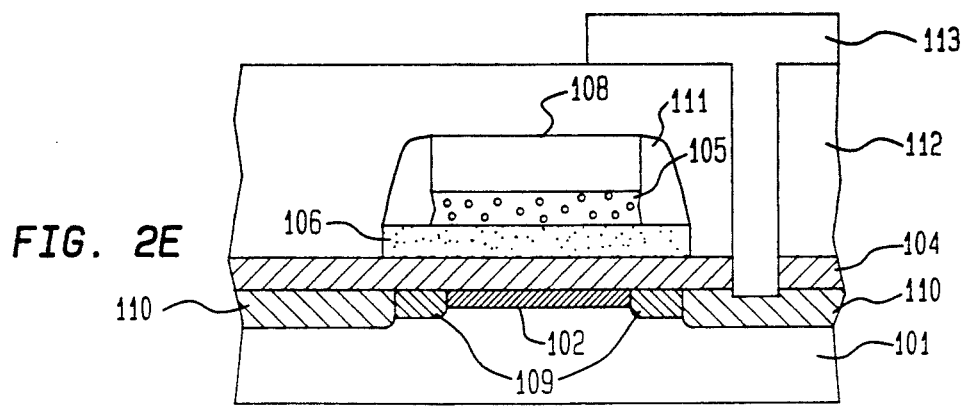

Thereafter, according to an ordinary producing process for MOS type semiconductor devices, an interlayer insulator film 112 was deposited on the entire surface, and aluminum wirings 113 were formed, resulting in a field-effect type semiconductor device as shown in FIG. 2E. In this figure, only a part of the aluminum wirings 113 is shown for simplicity (i.e., aluminum wirings for one of the source/drain regions and for the gate electrode are omitted from the figure).

The field-effect type semiconductor device obtained in this way had the following excellent advantages. Because the N⁻-type regions 109 were positioned under the gate electrode, the reliability and driving characteristics of the device were improved. Moreover, according to the method of this example, it was possible to readily control the threshold voltage and obtain field-effect type semiconductor devices with substantially the same inversion voltage value as the prescribed value in a high production yield.

In the aforementioned example, although the polycrystalline silicon film 105 and the amorphous silicon film 106 were used as a gate electrode, metals such as molybdenum or tungsten, or alternatively high-melting point metal compounds such as tungsten silicide, can also be used. For example, if a tungsten silicide film is etched to form a gate electrode which is in turn used as a mask for implantation of phosphorus ions, the silicon oxide film 108 is not necessarily needed. In this case, because the gate electrode obtained has a lower resistivity, it brings about the improvement of the operating speed of integrated circuits, as mentioned in Example 1.

Example 3

FIGS. 3A to 3E show the production of a field-effect type semiconductor device by another method of this invention. The method used in this example will be explained below with reference to these figures.

Figure 3A:
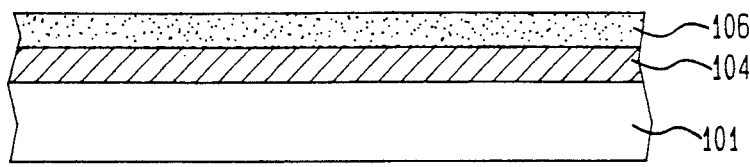
FIGS. 3A to 3E are sectional views showing still another method for producing field-effect type semiconductor devices according to this invention.

First, as shown in FIG. 3A, in the surface portion of a P-type silicon substrate 101, a gate insulator film 104 (the thickness thereof being 100 to 150 nm) was formed by thermal oxidation, after which an amorphous silicon film 106 (the thickness thereof being 50 to 60 nm) was formed thereon.

Figure 3B:
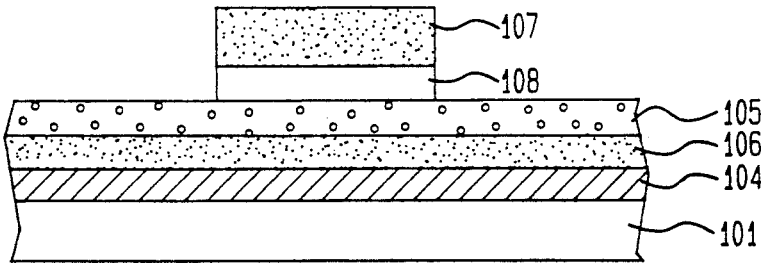

Then, as shown in FIG. 3B, a polycrystalline silicon film 105 (the thickness thereof being 150 to 250 nm) and a silicon oxide film 108 (the thickness thereof being 100 to 150 nm) were successively formed on the amorphous silicon film 106. Thereafter, the silicon oxide film 108 was etched with the use of a photoresist 107 as a mask, and the polycrystalline silicon film 105 was then etched with the silicon oxide film 108 as a mask. At that time, an oxide film which had been spontaneously formed on the surface of the amorphous silicon film 106 served as an etching stop layer.

Figure 3C:
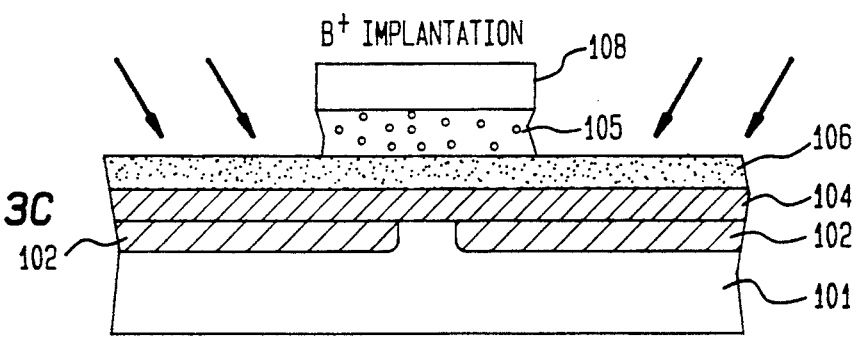

Next, for the purpose of controlling a threshold voltage of the device, impurity ions (e.g., boron ions, B⁺) were implanted in the P-type silicon substrate 101 through the gate insulator film 104 and the amorphous silicon film 106 along a direction inclined at an angle of about 45 degrees from the direction perpendicular to the surface of the P-type silicon substrate 101 to form P⁻-type regions 102, as shown in FIG. 3C. At that time, the implantation energy was set to a value in the range of 100 to 120 keV and the dose of impurity ions was set to a value in the range of 2 to $3 \times 10^{12}$ ions/cm⁻². In cases where Si(100) substrates are used, ion implantation along a direction inclined at an angle of about 30 or 60 degrees may increase the degree of channeling. Therefore, the inclination angle of ion beams is preferably set at a value in the range of 40 to 45 degrees and more preferably set at a value of about 45 degrees.

Subsequently, impurity ions (e.g., phosphorus ions, P⁺) were implanted in the P-type silicon substrate 101 through the gate insulator film 104 and the amorphous silicon film 106 with the use of the polycrystalline silicon film 105 and the silicon oxide film 108 as a mask to form N⁻-type regions 109 which serve as lightly doped drains (LDDs). The dose of impurity ions was set at a value in the range of 2 to $4 \times 10^{13}$ ions/cm⁻².

Figure 3D:
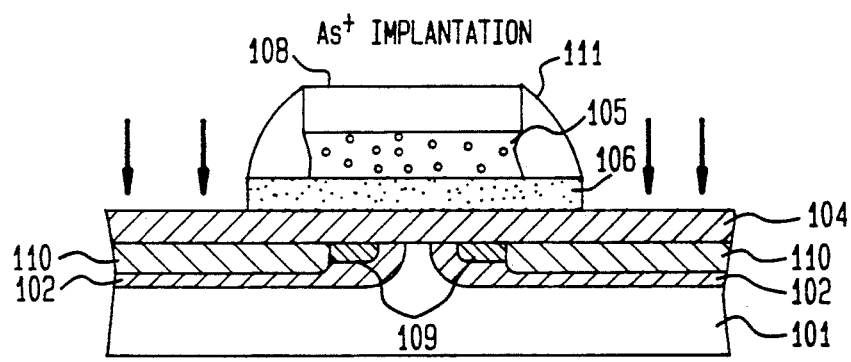

Then, on the entire surface, an oxide film was again deposited to have a flat surface, after which this oxide film and the amorphous silicon film 106 were etched in a self-aligned manner to form gate side walls 111 as shown in FIG. 3D. Then, impurity ions (e.g., arsenic ions, As⁺) were implanted in the P-type silicon substrate 101 through the gate insulator film 104 with the use of the silicon oxide film 108 and the gate side walls 111 as a mask to form N⁺-type source/drain regions 110 as shown in FIG. 3D. The dose of impurity ions was set at a value in the range of 4 to $7 \times 10^{15}$ ions/cm⁻².

Figure 3E:
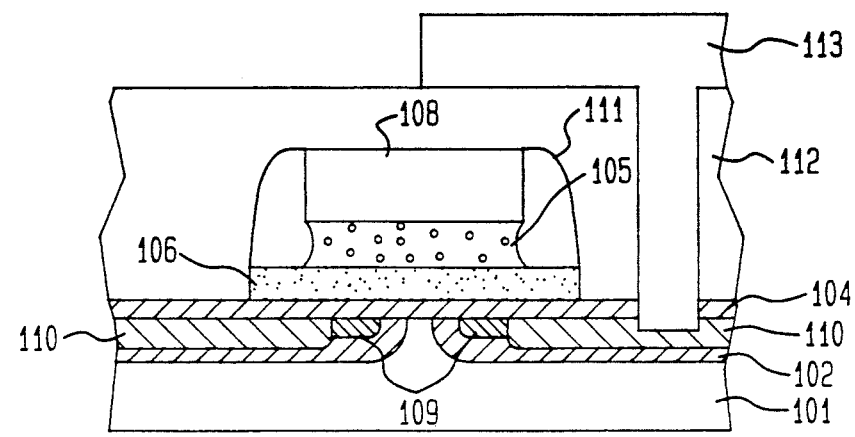

Thereafter, according to an ordinary producing process for MOS type semiconductor devices, an interlayer insulator film 112 was deposited on the entire surface, and aluminum wirings 113 were formed, resulting in a field-effect type semiconductor device as shown in FIG. 3E. In this figure, only a part of the aluminum wirings 113 is shown for simplicity (i.e., aluminum wirings for one of the source/drain regions and for the gate electrode are omitted from the figure).

The field-effect type semiconductor device obtained in this way had the following excellent advantages. Because the boron ions implanted for the purpose of controlling the threshold voltage prevented the depletion layer, which was formed between the source/drain regions 110, from extending down to the deep portion of the P-type silicon substrate 101, the inversion voltage did not deteriorate even in the case of field-effect type semiconductor devices with shorter channel lengths. Furthermore, because ion implantation was conducted for the purpose of controlling the threshold voltage after formation of the gate electrode, the impurity concentration at the center portion in the channel area was decreased to improve the driving characteristics of the device. These excellent advantages indicate that the method of this example is particularly suitable for miniaturization of transistor elements in integrated circuits.

Example 4

In this example, a three-dimensional process simulation was conducted to prove the excellent advantages attained by the method for producing a field-effect semiconductor device of this invention.

Figure 4:
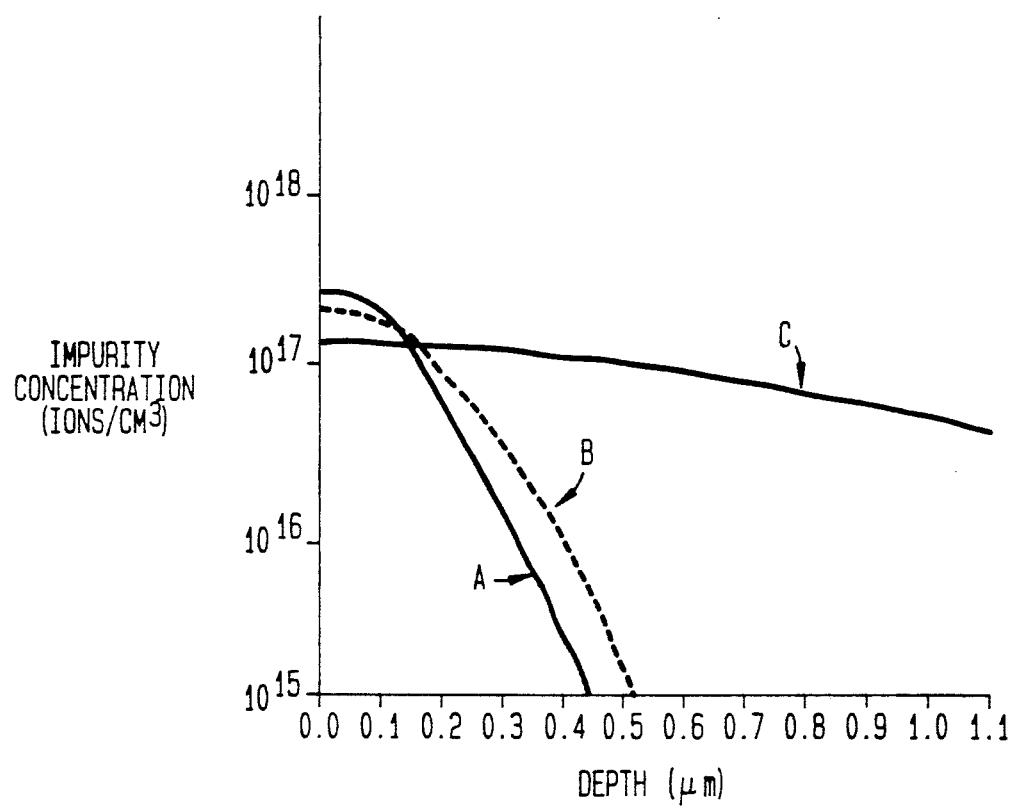
FIG. 4 is a graph showing the impurity profiles obtained by a three-dimensional process simulation.
Figure 5A:
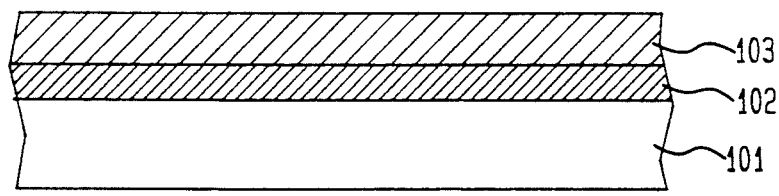
FIGS. 5A to 5D are sectional views showing a conventional method for producing field-effect type semiconductor devices.
Figure 5B:
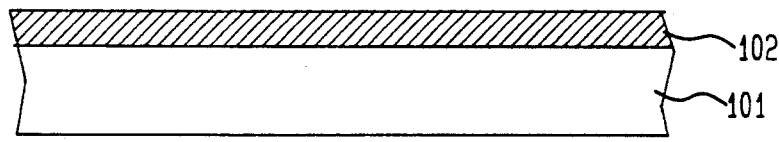
Figure 5C:
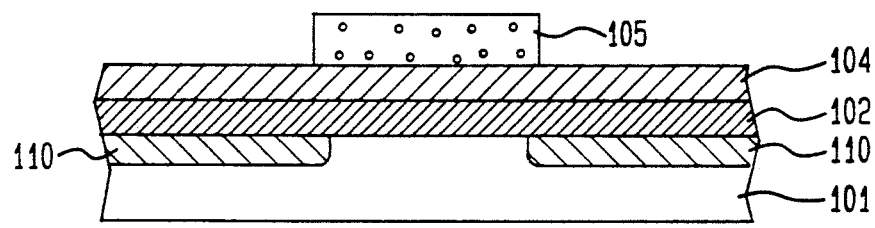
Figure 5D:
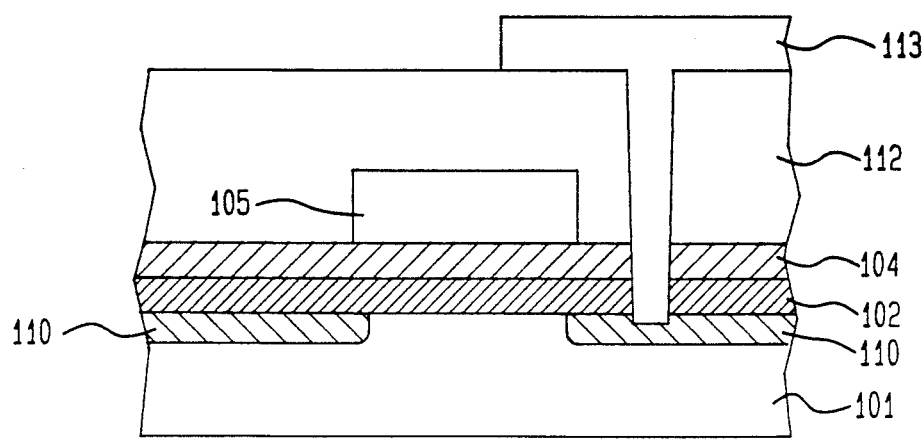

FIG. 4 shows the impurity profiles obtained by the three-dimensional process simulation at the center portion in the channel area of P-channel MOSFETs. The numbers on the abscissa indicate the depth from the substrate surface, while the numbers on the ordinate indicate the impurity concentration. Curve A shows the impurity profile obtained in the case where ion implantation was conducted for the purpose of controlling the threshold voltage after formation of the gate insulator film, according to the method of this invention. In that case, protective films for ion implantation, such as amorphous semiconductor films, were not used. Curve B shows the impurity profile obtained in the case where the gate insulator film was formed after ion implantation conducted for the purpose of controlling the threshold voltage, according to a conventional method. In that case, boron ions (i.e., B⁺) were used for ion implantation and the implantation energy was set at a value of 20 keV. Curve C shows the impurity profile obtained from the impurity ions (e.g., phosphorus ions, P⁻, in this case) present in the N well formed at the prescribed position of the substrate.

As can be seen from FIG. 4, the boron ions implanted for the purpose of controlling a threshold voltage according to the method of this invention are distributed in a shallower portion of the substrate, as compared with those implanted according to the conventional method. The depletion layer formed in the vicinity of the drain region is prevented from extending down to the deep portion of the substrate by the phosphorus ions distributed in a portion of the substrate corresponding to the depth (about 0.3 $\mu$m) of the source/drain regions. Therefore, if the distribution of boron ions is shallow, it is possible to obtain a high concentration of phosphorus ions in the deep portion of the substrate, which brings about an improvement of the breakdown voltage and no deterioration of the threshold voltage even in the case of field-effect type semiconductor devices with shorter channel lengths.

According to the method of this invention, it is possible to readily control the threshold voltage of field-effect type semiconductor devices and obtain substantially the same value as the prescribed value of the threshold voltage. Therefore, the method of this invention can provide a high production yield of integrated circuits and make a great contribution toward the miniaturization of transistor elements contained in the integrated circuits. Although all of the aforementioned examples have described various field-effect semiconductor devices using silicon, this invention is also applicable to any field-effect semiconductor device using a compound semiconductor such as GaAs, InP, or the like.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a field-effect type semiconductor device, said method comprising the steps of:
    forming a first insulator film, which serves as a gate insulator film, on a semiconductor substrate of a first conductivity type;
    forming a first conductor film on the first insulator film;
    forming a second conductor film on the first conductor film and patterning the second conductor film;
    implanting impurity ions in the semiconductor substrate through the first insulator film and the first conductor film from an inclined direction with the use of the patterned second conductor film as a mask for the purpose of controlling the threshold of the device;
    implanting impurity ions in the semiconductor substrate through the first insulator film and the first conductor film from a substantially perpendicular direction with the use of the patterned second conductor film as a mask to form a first semiconductor region of a second conductivity;
    thereafter forming a second insulator film on the entire surface and removing parts of said second insulator film by anisotropic etching, the remainder of said second insulator film forming a spacer composed of parts of the patterned second insulator film which are left on the side walls thereof after anisotropic etching of the second insulator film; and
    implanting impurity ions in the semiconductor substrate through the first insulator film from a substantially perpendicular direction with the use of the second conductor film and the spacer present on the side walls thereof as a mask to form a second semiconductor region of the second conductivity, wherein the first and second conductor films are employed as a gate electrode and the first and second semiconductor regions serve as a lightly doped drain (LDD) and source/drain region, respectively.

2. A method for producing a field-effect type semiconductor device according to claim 1, wherein the first conductor film is amorphous and the second conductor film is polycrystalline.

3. A method for producing a field-effect type semiconductor device according to claim 1, wherein the impurity ions used for controlling the threshold voltage are implanted along a direction inclined at an angle of 40 to 45 degrees from the direction perpendicular to the surface of the semiconductor substrate.

* * * * *